(12) United States Patent
Li (10) Patent No.: US 12,224,267 B2
(45) Date of Patent: Feb. 11, 2025

(54) CHIP INTERCONNECTING METHOD, INTERCONNECT DEVICE AND METHOD FOR FORMING CHIP PACKAGES

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 347 days.

(21) Appl. No.: 17/542,417

(22) Filed: Dec. 4, 2021

(65) Prior Publication Data

US 2022/0181297 A1    Jun. 9, 2022

(30) Foreign Application Priority Data

Dec. 4, 2020   (CN) .......................... 202011408981.5
Dec. 4, 2020   (CN) .......................... 202011411137.8
Dec. 4, 2020   (CN) .......................... 202011412884.3

(51) Int. Cl.
*H01L 25/065* (2023.01)
*H01L 21/48* (2006.01)
(Continued)

(52) U.S. Cl.
CPC ........ *H01L 25/0655* (2013.01); *H01L 21/486* (2013.01); *H01L 21/561* (2013.01);
(Continued)

(58) Field of Classification Search
CPC ...... H01L 25/0655; H01L 24/16; H01L 24/48
See application file for complete search history.

(56) References Cited

U.S. PATENT DOCUMENTS 10,593,641 B2    3/2020   Qiu et al.
10,651,126 B2    5/2020   Hsiung et al.
(Continued)

FOREIGN PATENT DOCUMENTS

CN    104218022        12/2014
CN    104617072 A      5/2015
(Continued)

OTHER PUBLICATIONS

Weiping Li, U.S. Appl. No. 17/542,415, Final Office Action issued Dec. 4, 2023.
(Continued)

*Primary Examiner* — Errol V Fernandes
(74) *Attorney, Agent, or Firm* — USCH Law, PC (57) ABSTRACT

The present disclosure provides a chip interconnecting method, an interconnect device and a method for forming a chip interconnection package. The method comprises arranging at least one chipset on a carrier, each chipset including at least a first chip and a second chip. A contact surface (or diameter) of each of the first bumps is smaller than that of any of the second bumps. The method further comprises attaching an interconnect device to the first chip and the second chip, the interconnect device including first pads for bonding to corresponding bumps on the first chip and second pads for bonding to corresponding bumps on the second chip. Attaching the interconnect device includes aligning the plurality of first pads with the corresponding bumps on the first chip whereby the plurality of second pads are self-aligned for bonding to the plurality of second bumps.

19 Claims, 4 Drawing Sheets

(51) Int. Cl.
*H01L 21/56* (2006.01)
*H01L 23/00* (2006.01)
*H01L 23/31* (2006.01)
*H01L 23/48* (2006.01)
*H01L 23/498* (2006.01)

(52) U.S. Cl.
CPC ........ *H01L 21/568* (2013.01); *H01L 23/3107* (2013.01); *H01L 23/481* (2013.01); *H01L 23/49827* (2013.01); *H01L 23/4985* (2013.01); *H01L 24/16* (2013.01); *H01L 24/48* (2013.01); *H01L 24/73* (2013.01); *H01L 24/81* (2013.01); *H01L 24/82* (2013.01); *H01L 24/95* (2013.01); *H01L 24/96* (2013.01); *H01L 2224/16157* (2013.01); *H01L 2224/16227* (2013.01); *H01L 2224/81143* (2013.01); *H01L 2224/81203* (2013.01); *H01L 2224/8212* (2013.01); *H01L 2224/82203* (2013.01); *H01L 2224/95001* (2013.01); *H01L 2924/10253* (2013.01); *H01L 2924/10272* (2013.01); *H01L 2924/10329* (2013.01); *H01L 2924/1033* (2013.01); *H01L 2924/15311* (2013.01)

(56) References Cited

U.S. PATENT DOCUMENTS

| | | |
|---|---|---|
| 10,796,999 B2 | 10/2020 | Koh et al. |
| 10,903,166 B2 | 1/2021 | Ganesan et al. |
| 11,075,166 B2 | 7/2021 | Li et al. |
| 2006/0284292 A1 | 12/2006 | Cheng |
| 2009/0020323 A1 | 1/2009 | Chen et al. |
| 2011/0068459 A1 | 3/2011 | Pagaila et al. |
| 2011/0084386 A1 | 4/2011 | Pendse |
| 2012/0061856 A1 | 3/2012 | Vora |
| 2015/0163904 A1 | 6/2015 | Karhade et al. |
| 2015/0228551 A1 | 8/2015 | Oi et al. |
| 2017/0287870 A1 | 10/2017 | Fang et al. |
| 2017/0301625 A1* | 10/2017 | Mahajan ............. H01L 23/5389 |
| 2019/0006281 A1 | 1/2019 | Georg et al. |
| 2019/0115319 A1 | 4/2019 | Hiner |
| 2019/0157205 A1 | 5/2019 | Deshpande et al. |
| 2020/0035603 A1 | 1/2020 | Rubin et al. |
| 2020/0051949 A1 | 2/2020 | Tsai et al. |
| 2020/0075546 A1 | 3/2020 | Shih et al. |
| 2020/0098692 A1* | 3/2020 | Liff ..................... H01L 23/5386 |
| 2020/0118973 A1* | 4/2020 | Wang ..................... H01L 24/24 |
| 2020/0176384 A1 | 6/2020 | Wu et al. |
| 2020/0176410 A1 | 6/2020 | Qiu et al. |
| 2020/0243449 A1 | 7/2020 | Chiang et al. |
| 2020/0303364 A1 | 9/2020 | Chen et al. |
| 2020/0312767 A1 | 10/2020 | Pietambaram et al. |
| 2020/0335443 A1 | 10/2020 | Zhou et al. |
| 2021/0020605 A1 | 1/2021 | Hiner |
| 2022/0199539 A1 | 6/2022 | Karhade |

FOREIGN PATENT DOCUMENTS

| | | |
|---|---|---|
| CN | 107017238 A | 8/2017 |
| CN | 110197793 A | 9/2019 |
| CN | 110707075 A | 1/2020 |
| EP | 3751607 | 12/2020 |
| TW | 200943440 A | 10/2009 |
| TW | 201535667 A | 9/2015 |
| TW | 202006842 A | 2/2020 |
| TW | 202015194 A | 4/2020 |
| TW | 202029449 A | 8/2020 |
| TW | I715257 B | 1/2021 |
| TW | 202135243 A | 9/2021 |

OTHER PUBLICATIONS

Shanghai Yibu Semiconductor Co., Ltd., CN the First Office Action, CN 202011411137.8, Jun. 22, 2021, 10 pgs.
Shanghai Yibu Semiconductor Co., Ltd., CN the Second Office Action, CN 202011411137.8, Sep. 14, 2021, 6 pgs.
Shanghai Yibu Semiconductor Co., Ltd., TW the First Office Action and Search Report, TW 110145135, Nov. 28, 2022, 9 pgs.
Shanghai Yibu Semiconductor Co., Ltd., TW the Second Office Action, TW 110145135, Jul. 31, 2023, 8 pgs.
Shanghai Yibu Semiconductor Co., Ltd., CN the First Office Action, CN 202011408981.5, Jun. 18, 2021, 10 pgs.
Shanghai Yibu Semiconductor Co., Ltd., CN the Second Office Action, CN 202011408981.5, Aug. 25, 2021, 9 pgs.
Shanghai Yibu Semiconductor Co., Ltd., CN the Third Office Action, CN 202011408981.5, Nov. 9, 2021, 13 pgs.
Shanghai Yibu Semiconductor Co., Ltd., TW the Second Office Action, TW 110145134, Dec. 21, 2022, 16 pgs.
Shanghai Yibu Semiconductor Co., Ltd., English Translation of KR First Office Action, KR10-2021-0171478, Dec. 3, 2021, 6 pgs.
Shanghai Yibu Semiconductor Co., Ltd., CN the First Office Action, CN 202011412884.3, Jun. 17, 2021, 14 pgs.
Shanghai Yibu Semiconductor Co., Ltd., TW the First Office Action, TW 110145240, Jun. 1, 2022, 3 pgs.
Shanghai Yibu Semiconductor Co., Ltd., English Translation of KR First Office Action, KR 10-2021-0171482, Dec. 3, 2021, 5 pgs.
Weiping Li, U.S. Appl. No. 17/542,415, Non-Final Office Action issued Jun. 8, 2023.
Weiping Li, U.S. Appl. No. 17/542,416, Non-Final Office Action issued Sep. 8, 2023.

* cited by examiner

100

101
Arranging at least one chipset on a surface of a carrier, each chipset including at least a first chip and a second chip, the first chip including first bumps formed on a front surface thereof, the second chip including second bumps formed on a front surface thereof, a contact surface of each of the first bumps being smaller than that of any of the second bumps

102
Attaching an interconnect device to a first portion of the front surface of the first chip and a second portion of the front surface of the second chip, the interconnect device having a first side and a plurality pads formed on a surface of the first side, the plurality of pads including a plurality of first pads for bonding to corresponding bumps on the first chip and a plurality of second pads for bonding to corresponding bumps on the second chip

102a
Attaching the interconnect device includes aligning the plurality of first pads with the corresponding bumps on the first chip whereby the plurality of second pads are self-aligned for bonding to the corresponding bumps on the second chip

CHIP INTERCONNECTING METHOD, INTERCONNECT DEVICE AND METHOD FOR FORMING CHIP PACKAGES

CROSS REFERENCE TO RELATED APPLICATIONS

This application claims the benefit of priority under the Paris Convention to Chinese Patent Application No. CN202011411137.8, filed Dec. 4, 2020, entitled "Method for Forming Chip Packages and a Chip Package," Chinese Patent Application No. CN202011408981.5, filed Dec. 4, 2020, entitled "Chip Interconnecting Method, Interconnect Device and Method for Forming Chip Packages," and Chinese Patent Application No. CN202011412884.3, filed Dec. 4, 2020, entitled "Method for Forming Chip Packages and a Chip Package," each of which is incorporated by reference herein in its entirety. This application is related to U.S. Patent Application Ser. No. 17/542,415, entitled "Method for Forming Chip Packages and a Chip Package," filed on even date herewith, and U.S. Patent Application Ser. No. 17/542,416, entitled "Method for Forming Chip Packages and a Chip Package," filed on even date herewith, each of which is incorporated by reference herein in its entirety.

FIELD

The present application is related to the field of semiconductors, and particularly to a method for forming chip packages and a chip package.

BACKGROUND

This section is intended to provide a background or context to the invention recited in the claims. The description herein is not admitted to be prior art by inclusion in this section.

With the advent of the artificial intelligence era, the trend of semiconductor integrated circuits is toward more functions and faster computation speeds. Due to Moore's law, circuit design is increasingly difficult and manufacturing cost is increasingly expensive by simply following the trend using system-on-chip (SOC) integration on large chips. The more practical solution is to use heterogeneous integration technology of multiple chiplets to accomplish functional integration. Based on this, an important task for high-end packaging at present is to develop a high-efficiency and high-density multi-chip interconnection technology, and to replace SOC integration of large chips by using direct connection between bare chips to form a physical layer functional block, thereby realizing low cost and high degree of freedom with the same functionality.

In the existing multi-chip interconnection technology, installation errors exist in the packaging process of a semiconductor chip. As a result, alignment bonding between a multi-chip chipset and an interconnect device is difficult to realize.

SUMMARY

In view of the above problems in existing technologies, a method of forming chip packages and a chip package thus formed are provided, with which the above problems can be solved.

In some embodiments, a chip interconnecting method is provided. The method comprises arranging a chipset including a first chip and a second chip on a surface of a carrier. In some embodiments, a plurality of first bumps are formed on the front surface of the first chip, a plurality of second bumps are formed on the front surface of the second chip, and a contact surface (or diameter) of each of the first bumps is smaller than that of any of the second bumps. The method further comprises attaching an interconnect device to parts of the front surfaces of the first chip and the second chip. In some embodiments, a plurality of first pads for bonding to corresponding first bumps and a plurality of second pads for bonding to corresponding second bumps are formed on a surface on one side of the interconnect device, and the plurality of first pads of the interconnect device are aligned and bonded to corresponding first bumps, so that the plurality of second pads of the interconnect device and corresponding second bumps are bonded in a self-alignment manner.

In some possible embodiments, the plurality of first bumps of the first chip include a plurality of high-density bumps, and the plurality of second bumps of the second chip include a plurality of low-density bumps. Correspondingly, the plurality of first pads are arranged with a higher density than the plurality of second pads.

In some embodiments, a fan-out circuit is formed between the plurality of first pads and the plurality of second pads of the interconnect device, so that the first chip included in each chipset can be electrically connected to the second chip through the interconnect device.

In some embodiments, the interconnect device includes vertical interconnect vias.

In some embodiments, the interconnect device is formed as a passive device or an active device.

In a second aspect, an interconnect device is provided. In some embodiments, a plurality of first pads and a plurality of second pads are formed on a surface on one side of the interconnect device. In some embodiments, the plurality of first pads are configured to bond to first bumps on a first chip, and the plurality of second pads are configured to bond to second bumps on a second chip, the first bumps having a higher density than the second bumps; and a fan-out circuit is formed between the first pads and the second pads of the interconnect device and is used for realizing electrical connections between the first pads and the second pads.

In some embodiments, a contact surface (or diameter) of each of the first bumps is smaller than that of any of the second bumps.

In some possible embodiments, the interconnect device is formed as an interconnect device with vertical interconnect vias.

In some embodiments, the interconnect device is formed as a passive device or an active device.

In some embodiments, the interconnect device includes a semiconductor material, including one or more of the following: silicon (Si), silicon carbide (SiC), gallium arsenide (GaAs), gallium nitride (GaN).

In some embodiments, the interconnect device includes an inorganic material, including one or more of glass and ceramic.

In some embodiments, the interconnect device includes a package substrate material including one or more of: printed Circuit Board (PCB), molded package substrate (EMC), flexible circuit board.

In some embodiments, the interconnect device includes a metal substrate material, including one or more of copper and aluminum.

In some possible embodiments, the interconnect device has certain additional functions of an integrated circuit, a micro-electro-mechanical system (MEMS), an optoelectronic component, and a passive component (IPD).

In a third aspect, a method of forming a package is provided, comprising: providing a carrier and at least one chipset. In some embodiments, each chipset at least comprises a first chip and a second chip; mounting a first chip and a second chip contained in each chipset on the surface of the carrier with the front surfaces of the first chip and the second chip facing upwards (or away from the carrier). In some embodiments, the front surface of the first chip is provided with first bumps, and the front surface of the second chip is provided with second bumps; attaching an interconnect device to portions of the front surfaces of the first and second chips in each chipset using the chip interconnecting method, whereby the first chip in each chipset is electrically connected to the second chip through the interconnect device; forming a molded encapsulation layer around the first chip and the second chip. In some embodiments, the first chip, the second chip and the interconnect device are embedded in the molded encapsulation layer; thinning the surface of one side of the molded encapsulation layer that is facing away from the carrier, so as to expose some of the first bumps of the first chip and some of the second bump of the second chip (e.g., the bumps not covered by or bonded to an interconnect device); forming third bumps on the surface of one side of the molded encapsulation layer, where the first bumps and the second bumps are exposed; and, removing the carrier.

In some possible embodiments, the number of chipsets is greater than 1, and the method further comprises: after the carrier is removed, the molded encapsulation layer with the chipsets embedded therein is diced to obtain a plurality of unit packages. In some embodiments, each unit package contains a chipset.

The embodiment of the application adopts at least one technical scheme which can achieve the following beneficial effects: it is commonly understood that, in the packaging process of the semiconductor chip, mounting errors occur inevitably. In some embodiments, each of the second bumps has a larger accommodating error space due to the larger contact area, and the first pads and corresponding first bumps are bonded first by precision alignment, so that the plurality of second pads of the interconnect device can be bonded to corresponding second bumps with the larger accommodating error space in a self-aligned manner. The problem of difficulty in alignment bonding caused by error is thus avoided.

The above summary is an overview of the technical solutions of some embodiments, which are described in more detail below with reference to drawings in order to make the aforementioned and other objects, features and advantages comprehensible.

BRIEF DESCRIPTION OF THE DRAWINGS

The advantages and benefits described herein, as well as other advantages and benefits, will be apparent to those of ordinary skill in the art upon reading the following detailed description of some embodiments. The drawings are only for purposes of illustrating exemplary embodiments and are not to be construed as limiting the invention recited in the claims. Also, like reference numerals are used to refer to like elements throughout. In the drawings:

In the drawings, the same or corresponding reference numerals indicate the same or corresponding parts.

DETAILED DESCRIPTION OF THE EMBODIMENTS

Certain embodiments of the present disclosure will be described in more detail below with reference to the accompanying drawings. While exemplary embodiments of the present disclosure are shown in the drawings, it should be understood that the present disclosure may be embodied in various forms and should not be limited to the embodiments set forth herein.

The following disclosure provides various embodiments, or examples, for implementing different features of the embodiments. Specific examples of components and arrangements are described below to simplify the present disclosure. These are, of course, merely examples and are not intended to limit the invention. For example, in the following description, attaching the interconnect device 13 to the front surfaces of the first chip 11 and the second chip 12 may include an embodiment in which the first chip 11, the second chip 12, and the interconnect device 13 are formed in direct contact, and may also include an embodiment in which additional members may be formed between the first chip 11, the second chip 12, and the interconnect device 13, so that the first chip 11, the second chip 12, and the interconnect device 13 may not be in direct contact. Further, the present invention may repeat reference numerals and/or characters in the various embodiments. This repetition is for the purpose of simplicity and clarity and does not in itself dictate a relationship between the various embodiments and/or configurations discussed.

It will be understood that terms such as "including" or "having," or the like, are intended to indicate the presence of the disclosed features, integers, steps, acts, components, parts, or combinations thereof, and are not intended to preclude the presence or addition of one or more other features, integers, steps, acts, components, parts, or combinations thereof.

Also, spatially relative terms, such as "below . . . ," "under . . . ," "down," "above . . . ," "up," and the like, may be used herein for ease of description to describe one element or component's relationship to another element (or other) component as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

It should be noted that certain embodiments and/or certain features of the embodiments may be combined with each other without conflict.

Certain embodiments of the present disclosure will be described in more detail below with reference to the accompanying drawings. While exemplary embodiments of the present disclosure are shown in the drawings, it should be understood that the present disclosure may be embodied in various forms and should not be limited to the embodiments set forth herein.

It should be noted that the embodiments and features of the embodiments may be combined with each other without conflict. The present invention will be described in detail below with reference to the embodiments with reference to the attached drawings.

Figure 1:
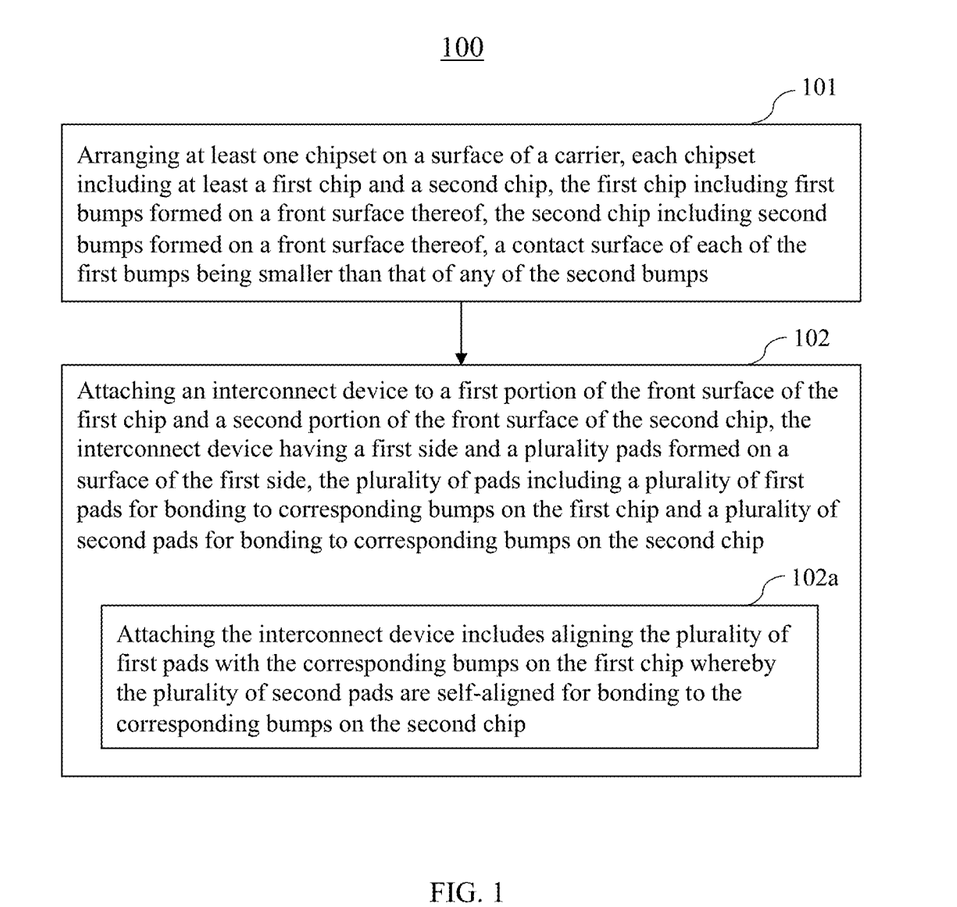
FIG. 1 is a schematic flow chart of a method of interconnecting chips in a process for forming a package according to some embodiments.

FIG. 1 is a flow chart illustrating a method 100 of forming a package according to an embodiment of the present application. As shown in FIG. 1, the method 100 may include steps 101-102, which are described in further details below.

Figure 2A:
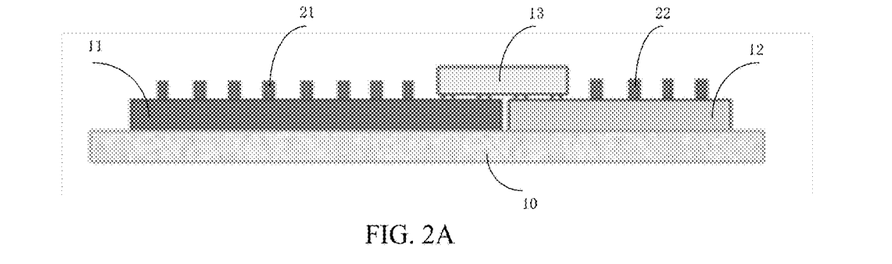
FIGS. 2A to 2E are schematic cross-sectional views at intermediate stages in a process of forming a package according to some embodiments.
Figure 2B:
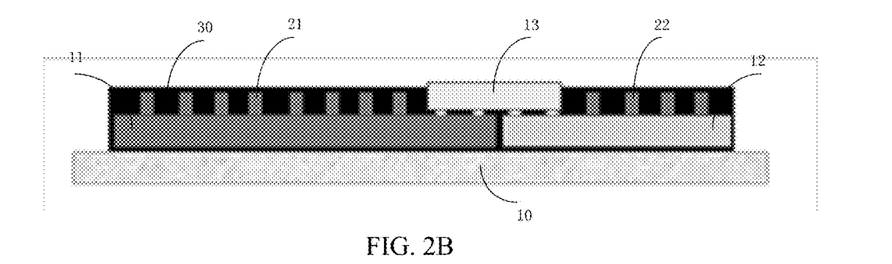
Figure 2C:
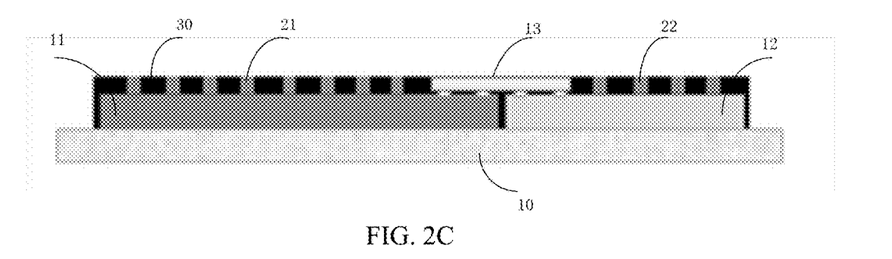
Figure 2D:
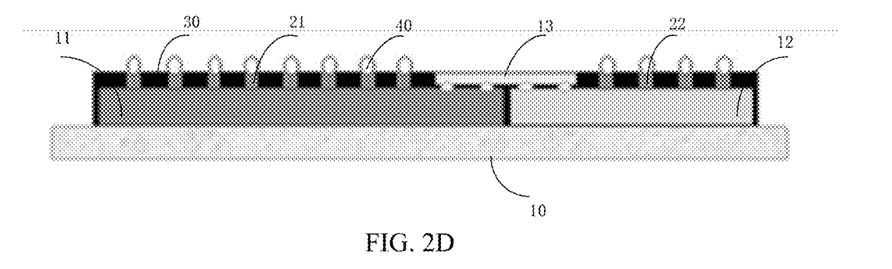
Figure 2E:
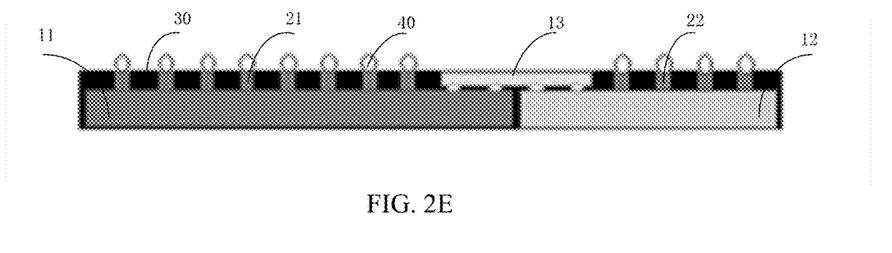

Referring to FIG. 2A, step 101 is performed, in which the first chip 11 and the second chip 12 may be mounted on a surface of the carrier 10 according to a preset chip pitch or a preset chip placement position, with the chips' front surfaces facing upward (away from the carrier). The front surface of the first chip 11 has first bumps 21, and the front surface of the second chip 12 has second bumps 22, which may also be referred to as chip pins, and the surface of the chip having the chip pins is generally referred to as the front surface, and the surface opposite to the front surface is referred to as the back surface. For example, in some embodiments, the first bumps 21 and the second bumps 22 may be formed as solder bumps made of a conductive material including Cu, Ag, Au, or the like, or alloys thereof, as well as other materials. For example, in some embodiments, two or more chips may be coupled to carrier 10 using automated machinery such as a packaging machine or manually. In some embodiments, an adhesive film (not shown) or a die attach film (not shown) may be used to couple the back sides of the first and second chips 11, 12 to either side of the carrier 10 such that the front sides of the first and second chips 11, 12 are shown outward away from the carrier 10, which may also be referred to as front-up (face-up) in a semiconductor package.

Figure 3A:
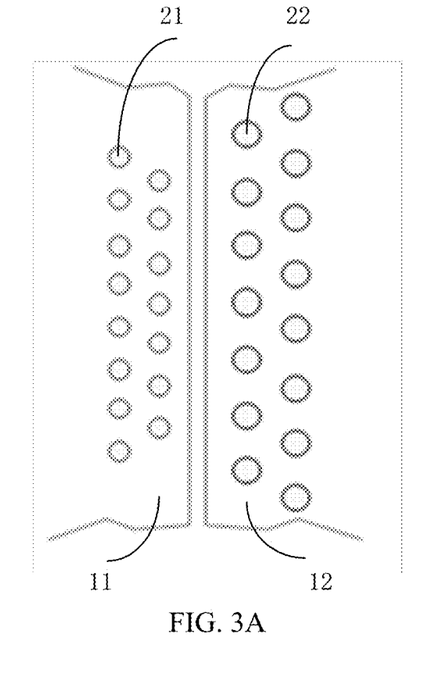
FIGS. 3A-3C are schematic diagrams illustrating a chip interconnection process according to some embodiments.

Referring to FIG. 3A, a schematic top view of the first chip 11 and the second chip 12 is shown. In some embodiments, the first chip 11 and the second chip 12 are arranged on the carrier surface side by side at intervals, and a first edge region of the first chip and a second edge region of the second chip are disposed on both sides of the gap between the first chip and the second chip. The first edge region of the first chip 11 has a plurality of first bumps 21, and the second edge region of the second chip has a plurality of second bumps 22. In some embodiments, a contact surface (or diameter) of each first bump 21 is smaller than that of any second bump 22.

It is understood that mounting errors inevitably occur during the packaging of the semiconductor chip. In step 101, when the first chip 11 and the second chip 12 are mounted on a surface on one side of the carrier 10, a certain degree of mounting pitch error may be generated. For example, the actual chip pitch between the first chip 11 and the second chip 12 is closer or farther than the pre-designed chip pitch. As another example, the chip placement positions designed in advance are that the first chip 11 and the second chip 12 are placed side by side in parallel, and in the actual placement process, the first chip 11 and the second chip 12 cannot be placed completely in parallel, but have an angle error. Mounting errors such as these are inevitably present during chip placement.

Referring to FIG. 2A, step 102 is performed, in which an interconnect device is attached to portions of the front surfaces of the first chip and the second chip.

Figure 3B:
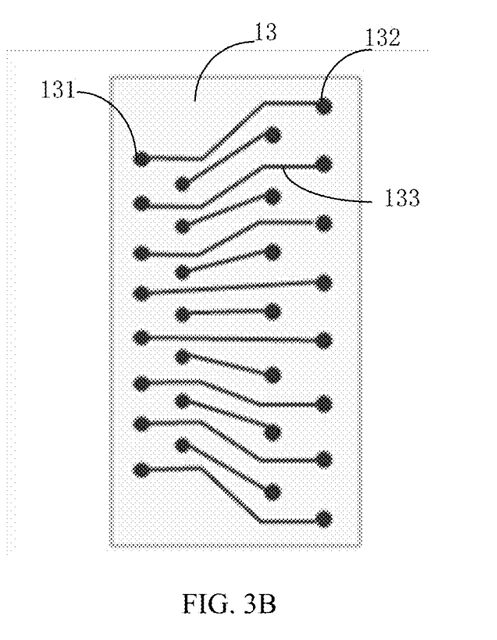

Referring to FIG. 3B, a plurality of first pads 131 and a plurality of second pads 132 are formed on a surface on one side of the interconnect device 13, the plurality of first pads 131 are used for respectively bonded to corresponding first bumps 21 formed on the front surface of the first chip 11, and the plurality of second pads 132 are used for respectively bonded to corresponding second bumps 22 formed on the front surface of the second chip 12.

In some embodiments, the interconnect device 13 is for attaching over a first edge region of the first chip and a second edge region of the second chip across a gap between the first chip and the second chip. A plurality of first pads 131 distributed on a surface on one side of the interconnect device 13 are used for being mutually jointed with the first edge region containing a plurality of first bumps 21, and a plurality of second pads 132 distributed are used for being mutually jointed with the second edge region containing a plurality of second bumps 22. It should be understood that the pad positions of the first pads 131 and the second pads 132 in the interconnect device are determined by preset chip placement positions and bump distribution positions on the first chip 11 and the second chip 12. For example, when the chip pitch between the first chip 11 and the second chip 12 determined in the chip design is wider, the first chip 11 and the second chip 12 shown in FIG. 3A need to be arranged according to the designed wider chip pitch, and the interconnect device 13 shown in FIG. 3B is also designed to be wider, or specifically, the gap between the first pad region and the second pad region in the interconnect device 13 is wider. In other words, in an ideal case, that is, in the absence of the above-described mounting errors, the interconnect device 13 may be attached over the first chip 11 and the second chip 12, and the plurality of first pads 131 and the plurality of second pads 132 in the interconnect device 13 can be simultaneously and precisely bonded to the corresponding bumps over the first chip and the second chip.

Since in step 101 there is an unavoidable installation error, in some embodiments, step 102 further includes specific mounting steps 102a for attaching the interconnect device 13 to the front surfaces of the first chip 11 and the second chip 12, which involves aligning and bonding the plurality of first pads of the interconnect device 13 to corresponding first bumps, whereby the plurality of second pads 132 of the interconnect device 13 are self-aligned and respectively bonded to corresponding second bumps 22 of the second chip. In other words, the plurality of first bumps 21 and the first pads 131 which are aligned and bonded are taken as reference, so that the plurality of second pads 132 of the interconnect device 13 are self-aligned and respectively bonded to corresponding second bumps based on the self-tension of the interconnect device.

Figure 3C:
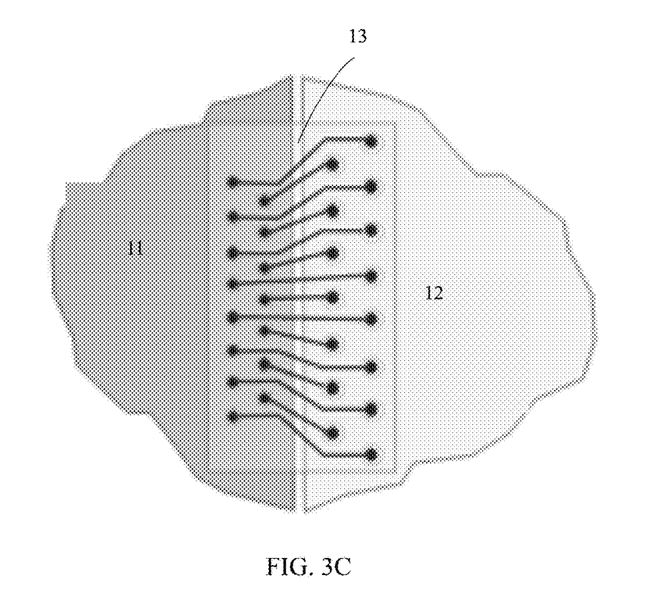

Referring to FIG. 3C, in some embodiments, the alignment bonding between the first pad 131 and corresponding first bumps 21 can be achieved first by precision alignment the first bumps 21 and the first pads 131, and after the plurality of first pads 131 of the interconnect device and corresponding first bumps 21 are respectively bonded to each other, the actual placement position of the interconnect device has been determined. At this time, the second bumps 22 have a larger tolerance due to its larger contact area, and the plurality of second pads 132 can be bonded by self-alignment onto corresponding second bumps having a larger tolerance based on the self-tension of the interconnect device 13. Thus, the alignment bonding between the plurality of first pads 131 and corresponding first bumps 21, and the self-alignment bonding between the plurality of second pads 132 and corresponding second bumps 22 can be realized, thus solving the problem of difficulty in alignment bonding due to placement errors.

In some embodiments, the first bumps 21 and the first pads 131 may have contact surfaces (or diameters) of the same or similar shape and size, and thus may facilitate precise alignment between the first bump 21 and the first pad 131. Alignment errors between the second bump 22 and the second pad 132 due to alignment errors between the first bumps 21 and the first pads 131 are thus avoided or reduced.

In some embodiments, referring to FIG. 3A, the plurality of first bumps 21 of the first chip 11 include a plurality of high-density bumps, and the plurality of second bumps 22 of the second chip 12 include a plurality of low-density bumps. Thereby, the high-density first bumps 21 and the first pads 131 can be bonded using high-precision alignment bonding, while the low-density first bumps 22 have a larger accommodating error space due to a larger contact area thereof, avoiding a problem of difficulty in alignment bonding due to errors.

In some embodiments, referring to FIG. 3B, a fan-out (fan-out) circuit 133 is formed between the plurality of first pads 131 and the plurality of second pads 132 of the interconnect device 13, the fan-out circuit 133 for electrically coupling between the coupled set of first pads and second pads, thereby enabling the first chip 11 to be electrically connected to the second chip 12 through the interconnect device 13 after the interconnect device 13 is attached on the first chip 11 and the second chip 12.

In some further embodiments, any other type of interconnection circuit may be formed between the plurality of first pads 131 and the plurality of second pads 132 of the interconnect device 13 as long as the interconnection circuit can achieve electrical coupling between any one or more first pads 131 and any one or more second pads 132.

In some embodiments, the contact surface (or diameter) of the first pad 131 is smaller than the contact surface (or diameter) of the second pad 132, so that the second pad 132 has a larger tolerance due to its larger contact area (or diameter), and after the first pad 131 and corresponding first bump 21 are aligned and bonded, the plurality of second pads 132 of the interconnect device 13 having the larger tolerance can be self-aligned and bonded onto corresponding second bumps having the larger tolerance. To improve the error tolerance, An interconnect device is provided in some embodiments, and FIG. 3B shows a schematic structural diagram of the interconnect device 13.

Referring to FIG. 3B, a plurality of first pads 131 and a plurality of second pads 132 are formed on a surface on one side of the interconnect device 13. In some embodiments, the plurality of first pads 131 are used for bonding to a first chip, and the plurality of second pads 132 are used for bonding to a second chip; a fan-out circuit 133 is formed between the plurality of first pads 131 and the plurality of second pads 132 of the interconnect device 13 for electrically connecting the plurality of first pads and the plurality of second pads.

In some embodiments, the interconnect device is formed as an interconnect device with vertical interconnect vias.

In some embodiments, the interconnect device is formed as a passive device or an active device.

In some embodiments, the interconnect device is made of a semiconductor material, including one or more of the following: silicon (Si), silicon carbide (SiC), gallium arsenide (GaAs), gallium nitride (GaN).

In some embodiments, the interconnect device is an inorganic material, including one or more of the following: glass, ceramic.

In some embodiments, the interconnect device is a package substrate material including one or more of the following: printed Circuit Board (PCB), molded package substrate (EMC), flexible circuit board.

In some embodiments, the interconnect device is a metal substrate material, including one or more of the following: copper and aluminum.

In some embodiments, the interconnect device is accompanied by functions of an integrated circuit, a micro-electromechanical system (MEMS), an optoelectronic component, and a passive component (IPD). The embodiment of the application also provides a method for forming the packaging piece. FIG. 2A-2E show cross-sectional schematic views illustrating intermediate stages in the process of forming chip packages according to some embodiments.

According to some embodiments, a method of making chip packages comprises providing a carrier 10 and at least one set of chips. In some embodiments, each set of chips comprises at least a first chip 11 and a second chip 12. Referring to FIG. 2A, the first chip 11 and the second chip 12 in each chipset are mounted on the surface of the carrier 10 with their front surfaces facing upward (or away from the carrier). In some embodiments, the front surface of the first chip 11 has first bumps 21, and the front surface of the second chip 12 has second bumps 22. The method further comprises attaching interconnect devices 13 to portions of the front surfaces of the first chip 11 and the second chip 12 included in each chipset by using the method according to the above embodiment, so that the first chip 11 included in each chipset can be electrically connected to the second chip 12 through the interconnect devices 13; referring to FIG. 2B, a molding compound layer 30 is formed around the first chip 11 and the second chip 12. In some embodiments, the first chip 11, the second chip 12 and the interconnect device 13 are embedded in the molding compound layer 30; referring to FIG. 2C, thinning the surface of the molding compound layer 30 away from the carrier 10 to expose some of the first bumps 21 of the first chip 11 and the second bumps 22 of the second chip 12 (e.g., the first bumps not covered by or bonded to an interconnect device); referring to FIG. 2D, third bumps 40 is formed on a surface of the molding compound layer 30 on a side where the first bumps 21 and the second bumps 22 are exposed; and, referring to FIG. 2E, the carrier 10 is removed.

In a possible embodiment, the number of the chip sets is greater than 1, and the method further includes: after removing the carrier 10, the molded encapsulation layer with the chipsets embedded therein is diced to obtain a plurality of unit packages, each of which contains a chipset. Thereby enabling large-scale packaging.

Figure 4:
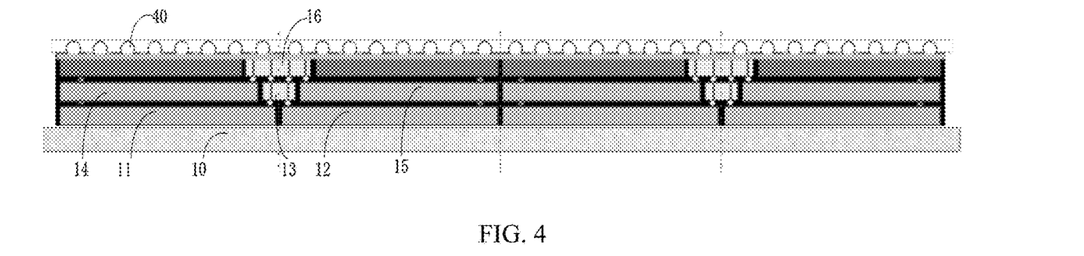
FIG. 4 is a schematic structural diagram of a stacked chip package using interconnect devices according to some embodiments.

The chip interconnecting method and the interconnect device provided by the embodiment of the application can also be applied to packaging semiconductor chips in a stacked manner. For example, referring to FIG. 4, a carrier 10 and multiple layers of chips may be provided. Referring to FIG. 4, a first chip 11 and a second chip 12 included in a first layer of chips may be mounted on a surface of the carrier 10 with their front surfaces facing upward (e.g., away from the carrier). Thereafter, an interconnect device 13 is attached to portions of the front surfaces of the first chip 11 and the second chip 12 included in the first layer of chips by using a chip interconnecting method, such as the chip interconnecting method described above with reference to FIG. 1, so that the first chip 11 included in the first layer of chips can be electrically connected to the second chip 12 through the interconnect device 13. In some embodiments, a third chip 14 and a fourth chip 15 included in a second layer of chips are mounted with their front surfaces facing upwards on the front surfaces of the first chip 11 and the second chip 12 and on two sides of the interconnect device 13. Afterwards, an interconnect device 16 is attached to part of the front surfaces of the third chip 14 and the fourth chip 15 included in the second layer of chips by using a chip interconnecting method, such as the chip interconnecting method described above with reference to FIG. 1, so that the third chip 14 included in the second layer of chips can be electrically connected to the fourth chip 15 through the interconnect device 16 and at the same time connected to the interconnect device 13. Through the interconnect devices 13 and 16, the first chip 11 and the second chip 12 included in the first layer of chips and the third chip 14 and the fourth chip 15 included in the second layer of chips can be electrically connected. As shown in FIG. 4, additional chips may be stacked over the third and fourth chips 14 and 15 and on two sides of the interconnect device 16, and a redistribution layer and/or external solder bumps 40 can then be formed over the chip layers. Therefore, the electrical connection between the multilayer chips can be realized by utilizing the interconnect devices according to some embodiments.

While the spirit and principles of the invention have been described with reference to several particular embodiments, it is to be understood that the invention is not limited to the disclosed embodiments, nor is the division of aspects, which is for convenience only as the features in such aspects may not be combined to benefit. The invention is intended to cover various modifications and equivalent arrangements included within the spirit and scope of the appended claims.

What is claimed is:

1. A method of chip interconnection, comprising:
arranging at least one chipset on a surface of a carrier, each chipset including at least a first chip and a second chip, the first chip including first bumps formed on a first portion of a front surface of the first chip, the second chip including second bumps formed on a first portion of a front surface of the second chip, wherein the first bumps include a plurality of first bumps having a first density and the second bumps include a plurality of second bumps having a second density, the first density being higher than the second density; and
attaching an interconnect device to the first portion of the front surface of the first chip and to the first portion of the front surface of the second chip, the interconnect device having a first side and a plurality pads formed on the first side, the plurality of pads including a plurality of first pads for respectively bonding to the plurality of first bumps having the first density on the first chip and a plurality of second pads for respectively bonding to the plurality of second bumps having the second density on the second chip, wherein attaching the interconnect device includes:
aligning and bonding the plurality of first pads with respective ones of the plurality of first bumps having the first density on the first chip; and
after a placement position of the interconnect device is fixed due to the plurality of first pads being respectively bonded with respective ones of the plurality of first bumps, bonding the plurality of second pads to respective ones of the plurality of second bumps having the second density on the second chip by self-alignment bonding.

2. The method of claim 1, wherein an area or diameter of a contact surface of each of the first bumps is smaller than that of any of the second bumps.

3. The method of claim 1, wherein the plurality of second pads correspond, respectively, to the plurality of first pads, and wherein the interconnect device includes a fan-out circuit interconnecting, respectively, the plurality of first pads with corresponding ones of the plurality of second pads to enable the first chip to be electrically connected to the second chip through the interconnect device.

4. The method of claim 1, wherein each interconnect device includes vertical interconnect vias.

5. The method of claim 1, wherein each interconnect device includes an active device.

6. The method of claim 1, wherein the first chip further includes third bumps formed on a second portion of the front surface of the first chip, and the second chip further includes fourth bumps formed on a second portion of the front surface of the second chip, the interconnect device includes a fan-out circuit interconnecting the plurality of first pads with corresponding ones of the plurality of second pads;
the method further comprising:
forming a molded encapsulation layer over the carrier whereby the first chip, the second chip and the interconnect device are embedded in the molded encapsulation layer;
thinning one side of the molded encapsulation layer that is facing away from the carrier to expose the third bumps and the fourth bumps;
forming fifth bumps on the one side of the molded encapsulation layer facing away from the carrier, wherein each of the fifth bumps is electrically coupled to at least one of the first third bumps and the fourth bumps; and
removing the carrier.

7. The method of claim 6, wherein the at least one chipset includes multiple chipsets, the method further comprising:
after removing the carrier, dicing the molded encapsulation layer with the multiple chipsets embedded therein to obtain a plurality of unit packages, wherein each unit package includes a chipset.

8. The method of claim 1, further comprising forming a molded encapsulation layer over the carrier, wherein the interconnect device is attached to the first portion of the front surface of the first chip and the first portion of the front surface of the second chip before the first chip and the second chip are embedded or partially embedded in the molded encapsulation layer.

9. The method of claim 6, wherein the first chip is electrically connected to the second chip through the interconnect device before the first chip and the second chip are embedded or partially embedded.

10. The method of claim 1, further comprising forming a molded encapsulation layer over the carrier, wherein the interconnect device is attached to the first portion of the front surface of the first chip and the first portion of the front surface of the second chip before the first chip and the second chip are embedded or partially embedded in any portion of the molded encapsulation layer.

11. The method of claim 6, wherein the first chip is electrically connected to the second chip through the interconnect device before the first chip and the second chip are embedded or partially embedded in any portion of the molded encapsulation layer.

12. The method of claim 1, wherein the first bumps are solder bumps, and the second bumps are solder bumps.

13. The method of claim 12, wherein an area or diameter of a contact surface of each of the first bumps is smaller than that of any of the second bumps.

14. The method of claim 1, wherein the interconnect device includes through silicon vias extending through the interconnect device between the first side and an opposing second side, the method further comprising forming I/O pins on a surface on the second side of the interconnect device.

15. The method of claim 6, further comprising:
forming a redistribution layer on the one side of the molded encapsulation layer facing away from the carrier, wherein the fifth bumps are formed on the redistribution layer.

16. The method of claim 15, wherein forming the fifth bumps on the one side of the molded encapsulation layer facing away from the carrier comprises:
forming a solder covering layer on the one side of the molded encapsulation layer facing away from the carrier.

17. The method of claim 1, wherein each of the plurality of second bumps has a contact area that is greater than a contact area of any of the plurality of first bumps and provides sufficient tolerance to allow the plurality of second pads to be respectively bonded by self-alignment bonding to the plurality of second bumps based on self-tension of the interconnect device.

18. The method of claim 6, wherein each of the plurality of second bumps has a contact area that is greater than a contact area of any of the plurality of first bumps to provide sufficient tolerance to allow the plurality of second pads be respectively bonded by self-alignment bonding to the plurality of second bumps based on self-tension of the interconnect device.

19. The method of claim 1, wherein the each chip set further includes a third chip and a fourth chip, the third chip including third bumps formed on a first portion of a front surface of the third chip, the fourth chip including fourth bumps formed on a first portion of a front surface of the second chip, wherein the third bumps include a plurality of third bumps having a third density and the fourth bumps include a plurality of fourth bumps having a fourth density, the third density being higher than the fourth density, the method further comprising:
mounting the third chip over a second portion of the front surface of one of the third chip and the fourth chip, and mounting the fourth chip over a second portion of the front surface of the other one of the third chip and the fourth chip;
attaching an additional interconnect device to the first portion of the front surface of the third chip and to the first portion of the front surface of the fourth chip, the additional interconnect device having a first side and a plurality pads formed on the first side, the plurality of pads including a plurality of third pads for respectively bonding to the plurality of third bumps having the third density on the third chip and a plurality of fourth pads for respectively bonding to the plurality of fourth bumps having the fourth density on the fourth chip, wherein attaching the additional interconnect device includes:
aligning and bonding the plurality of third pads to respective ones of the plurality of third bumps having the third density on the third chip; and
after a placement position of the additional interconnect device is fixed due to the plurality of third pads being respectively bonded with respective ones of the plurality of third bumps, bonding the plurality of fourth pads to respective ones of the plurality of fourth bumps having the fourth density on the fourth chip by self-alignment bonding.

* * * * *